US006437577B1

(12) United States Patent
Fritzmann et al.

(10) Patent No.: US 6,437,577 B1
(45) Date of Patent: Aug. 20, 2002

(54) CIRCUIT TO TEST THE WORKING OF AT LEAST ONE ANTENNA

(75) Inventors: Martin Fritzmann, Neu-Ulm; Thomas Wagner, Trunkelsberg, both of (DE)

(73) Assignee: Nokia Mobile Phones Ltd., Espoo (FI)

( * ) Notice: Subject to any disclaimer, the term of this patent is extended or adjusted under 35 U.S.C. 154(b) by 0 days.

(21) Appl. No.: 09/575,440

(22) Filed: May 22, 2000

(30) Foreign Application Priority Data

May 22, 1999 (DE) ........................................ 199 23 729

(51) Int. Cl.[7] ................................................ G01R 31/08

(52) U.S. Cl. ....................... 324/523; 324/527; 324/529; 343/703

(58) Field of Search .......................... 343/703; 324/503, 324/523, 501, 521, 527, 529; 73/53.01

(56) References Cited

U.S. PATENT DOCUMENTS

| | | | | |
|---|---|---|---|---|
| 4,765,179 A | * | 8/1988 | Fuller et al. | 73/53 |
| 5,153,524 A | * | 10/1992 | McCormack | 324/627 |
| 5,194,816 A | * | 3/1993 | Steele | 324/529 |

FOREIGN PATENT DOCUMENTS

| | | |
|---|---|---|
| DE | 4220904 | 1/1994 |
| DE | 19538109 | 4/1997 |
| DE | 19627349 | 1/1998 |
| EP | 0859237 | 2/1998 |
| JP | 09148958 | 6/1997 |

* cited by examiner

*Primary Examiner*—N. Le
*Assistant Examiner*—Vincent Q. Nguyen
(74) *Attorney, Agent, or Firm*—Antonelli, Terry, Stout & Kraus, LLP

(57) ABSTRACT

A circuit to test the working of antennas for a radio telephone. The antennas each have a radiator with one end that open rises up into the space. The test currents flow through antenna wires to the antennas independent of a signal current ($I_{RF}$). A secondary path with an impedance that is parallel to the RF path is connected to each radiator to return the separate test currents. A voltage evaluator monitors the operating state of the antennas by comparing the test voltages induced by the test currents at the antenna connections with a reference value and generates corresponding indication signals that provide information on the operating state of the antennas.

39 Claims, 3 Drawing Sheets

CIRCUIT TO TEST THE WORKING OF AT LEAST ONE ANTENNA

TECHNICAL FIELD

The invention pertains to a circuit to test the working of an antenna, especially an antenna for a radio telephone that has more than one antenna. The invention allows the radio telephone to detect a malfunction in the antenna wire or detect a missing, incorrectly mounted or failed vehicle antenna, for example as the result of damage from an accident, at any time and to automatically switch to a operative antenna.

Due to the fact that a radio telephone only works when all components of the communication system work and that antennas are often mechanically sensitive due to their location, the solution according to the invention significantly increases the reliability of a radio telephone in an emergency.

BACKGROUND OF THE INVENTION

Telephones in vehicles are usually equipped with an external or window mounted antenna. The location of this antenna is primarily determined by the requirements that need to be met to achieve optimal transmitting quality.

One disadvantage of selecting such a location is that the probability of damaging the antenna to the point of total failure is high the vehicle is involved in an accident or when other external forces act on the antenna. In particular, these other external forces acting on external antennas include, for example, the intentional destruction of the antenna by a stranger or the breaking off of the antenna while passing under an obstacle with low clearance. The total failure of the antenna can have fatal consequences in a traffic accident or when the vehicle is damaged as it is not possible then to make a telephone call in order to call for help.

To eliminate this imperfection an emergency or back-up antenna is installed in a different location as stated in publication EP 0 859 237-A1. This secondary antenna is then used for sending/receiving after the external antenna used as the main antenna fails. Each antenna is connected to the radio telephone via a separate coaxial cable.

To obtain the maximum transmission quality and to prevent interference during communication, the emergency antenna is not in operation while the main antenna is working. This means that the emergency antenna and the corresponding wire are only to be put into operation in an emergency by the manual or automatic initiation of an emergency call. To accomplish this, an emergency call button is activated or the air bag and/or seat belt mechanism controller sends a corresponding control signal to the radio telephone when switch over the radio telephone to the secondary antenna connection.

In principle, there are various solutions used to switch the radio telephone to the emergency antenna:

In simple solutions, the initiation of an emergency call in the radio telephone will automatically force the radio telephone to switch to the connection for the emergency antenna regardless of whether or not the main antenna is still operational. One requirement for this to occur is that there must be a high probability that the emergency antenna and its separate antenna wire still working due to installation in a protected location.

However, malfunctions or damage to the antenna feed cable leading to the emergency antenna can arise when operating the vehicle or connecting the antenna during the manufacture of the vehicle that remain undetected because the emergency antenna is not used during normal operation. Under certain circumstances, this antenna may not work properly in an emergency. Additionally, its efficiency is generally lower that that of the main antenna when installed in the interior of the vehicle. This may also lead to the inability to connect to the base station using the less powerful emergency antenna when the vehicle is in an unfavorable position although the connection could be made using an intact main antenna.

To avoid this disadvantage, radio telephones with several antenna connections and other accessories periodically perform a test procedure in which the antennas are operated alternately and tested to see if they are working properly. This can be done, for example, by comparing the signal strength of the signal received or, in accordance with publication EP 0 859 237 A1, by comparing the signal strengths of the signal supplied and the signal reflected back by the antenna. In this manner, malfunctions and damage to the antennas and the wires will be detected and indicated, and the unit can quickly switch to a working path of the antenna. The test procedure is also generally performed when an emergency call is triggered so that the unit only switches to the less powerful emergency antenna when the main antenna has failed due to the whip being broken off, for example. When both antennas also have different reception results due to having different designs and locations, this method is not very reliable due to the unequal intensities of the signals received.

For a test procedure according to the publication EP 0 859 237 A1 the antenna matching is measured by determining the reflection factor on the antenna wire with a bi-directional measuring coupler and a circuit to produce the quality signal. A disadvantage of this solution is the complexity of the hardware and software used to implement the test procedure.

In addition, there is already a device for testing vehicle antennas in publication DE 196 27349-A1 that constantly monitors vehicle antenna receiving coils in current loops with a low idle test current. In a rail car the receiving coils receive inductive signal currents as input along a conductor such as the tracks or the overhead wires. The idle test current is preferably a DC current and continuously shows that all antennas on the vehicle are present as well as connected.

One disadvantage of this, however, is that these vehicle antennas are not the type of antenna preferred for use in motor vehicles, such as an rod aerial fed asymmetric, but are in the form of receiving coils used to inductively detect signals. Therefore the solution can only be used for motor vehicles when the well-known folded dipole antenna with a loop radiator element is used instead of the previously used rod or dipole antenna with a pole radiator with their inherent advantages. This is more complex in comparison to the solutions used and does not provide any significant advantages for the intended application. Another disadvantage of the known solution is that a short-circuited antenna wire will also be displayed as a working antenna.

It is therefore the task of invention to create a simple and economical circuit to test the working of at least one antenna for a radio telephone that avoids the shortcomings stated and can be used regardless of the shape or type of the antenna for the most part. In addition the invention should uniquely identify different types of possible connection errors when connecting several antennas to a radio telephone.

DISCLOSURE OF INVENTION

The solution according to the invention contains an antenna with an open radiator such as a pole radiator, for example. The antenna has one end on which an antenna wire is connected for detecting or supplying the RF signal and a second end that projects into space so that the capacitance of the rod distributed in space creates an RF path that closes the signal circuit for communication purposes. To accomplish the task the radio telephone sends a test current to the antenna via the antenna wire. This is independent from the signal current. The test current is preferably a DC current or an AC current with a wavelength that is many times longer than the wavelength of the signal current.

According to the invention there is a secondary path with an impedance connected to the radiator that creates a return path for the test current flowing to the antenna wire and that is parallel to the RF path. The test current causes a drop in voltage across this impedance.

In contrast to the known solution the circuit contains a voltage evaluator that constantly monitors the voltage on the antenna connections of the radio telephone that arises due to the test current flowing through the impedance. In this manner the radio telephone not only detects if the pole radiator is correctly connected to the antenna connection, but also if there are any short circuits in the antenna wire.

The impedance value of the secondary path is many times higher than the radiation resistance of the antenna for the signal current as well as for the test current. The impedance is connected to the radiator by a connecting wire that is short in comparison to the transmission wavelength.

According to a special feature of the invention, the impedance of the secondary path consists of an elongated structure whose length, when it is a single component, for example, is of the same order of magnitude as the length of the rod antenna, or it consists of several discrete elements connected in series so that the connection wires to each element in the secondary path are short in comparison to the operating wavelength and have as little effect as possible on the RF characteristics of the radiator.

The invention will be explained in more detail using the following examples. The corresponding drawings show:

BEST MODES FOR CARRYING OUT THE INVENTION

Figure 1:
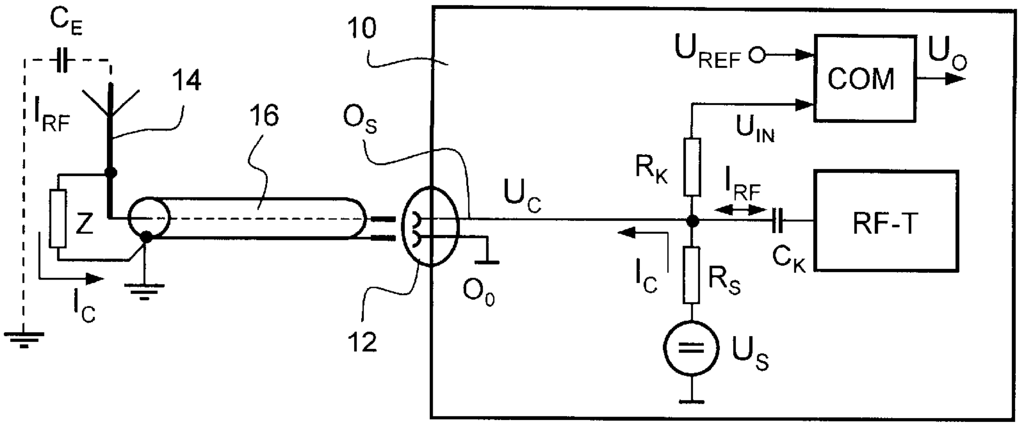
FIG. 1 The basic principle of the circuit according to the invention

A radio telephone 10 has, as shown in FIG. 1, a transceiver RF-T. The transceiver is connected via antenna connection 12 to an antenna 14, which is preferably designed as an external antenna and which is mounted on the roof of a vehicle (not shown). An antenna wire 16, in the present case a coaxial cable that is generally installed under the interior paneling of the vehicle, connects the antenna 14, which is located a distance from the radio telephone 10, to the antenna connection 12. Faults and damage to the antenna wire 16 and to the antenna connection 12 resulting from the hidden installation are difficult to detect visually. Antenna connection 12 contains a signal contact $O_S$ and a ground contact $O_O$.

In this example the antenna 14 is the well-known vertical pole radiator with a length of almost one-fourth of the transmission wavelength $\lambda$ of the transceiver signal. The antenna wire 16 is connected to the lower end of the radiator. The other end projects into space to receive/send high-frequency radiation into open space.

As is well known, the open end of the radiator and the surface of the earth forms a capacitance $C_E$ distributed in space which closes the circuit for the high-frequency signal current $I_{RF}$ as a capacitive RF path without an electrically conducting path existing between the open end of the radiator and the ground contact GND. Because the antenna 14 is mounted on a vehicle body, there is a direct connection between the ground contact GND, the antenna wire 16 and the conducting surface of the vehicle body.

In addition to the transceiver RF-T there is a voltage source as well as a voltage evaluator input connected to the signal contact $O_S$. In this example the voltage source supplies a source voltage $U_S$ and causes a test current $I_C$ to flow to the antenna 14 through a source resistor $R_S$. However, a current source, which has the advantage of supplying a constant current level, can be used instead of the voltage source. The voltage evaluator in this design is a window comparator COM that determines if its input voltage $U_{IN}$ lies within a specified range.

According to the invention the pole radiator of the antenna 14 is directly connected to a secondary path that contains an impedance Z. The secondary path closes the circuit for the test current $I_C$ from the pole radiator to the ground contact GND. The impedance Z and the source resistor $R_S$ form a voltage divider. The test current $I_C$ creates a test voltage $U_C$ across the impedance Z. The voltage value depends on the value of the effective impedance between the signal contact $O_S$ and the ground contact $O_O$. If the antenna 14 is missing or not connected, the test voltage $U_C=U_S$, while the voltage $U_C/n=0$ when the antenna connection 12 or the antenna wire 16 contains a short circuit. The window comparator COM compares the test voltage $U_C=U_{IN}$ with a reference voltage $U_{REF}$ and generates an indication signal $U_O$ that corresponds to the operating state of antenna 14 for a control circuit (not shown) of the radio telephone 10.

To keep the influence of the secondary path on the radiation properties of antenna 14 as low as possible, the impedance Z is connected to the pole radiator via a short (as compared to the transmission wavelength $\lambda$) connection wire.

The ratio of the impedance Z and source resistor $R_S$ is advantagious selected so that for the window comparator COM the test voltage $U_C=U_S/n$ on signal contact $O_S$ differs significantly from the source voltage $U_S$ that arises when there is a malfunction in antenna 14. It is important for working of the circuit that the impedance Z is connected as tightly as possible to antenna 14 so that a missing antenna 14 will be just as reliably detected by an increase in test voltage $U_C$ on signal contact $O_S$ as a break in the antenna wire 16. The impedance Z can be formed by a discrete resistor element R or by a conducting element such as a thin conductor path with a high resistance value that is located in the body of the antenna as an isolated resistive path or whose surface forms an isolated resistive path. Even a complex device such as an inductor with a correspondingly high series resistance can be advantageously used.

According to an especially advantageous design, the impedance Z is an ohmic resistor with a resistance value close to or the same as the source resistor $R_S$ so that about one half of the source voltage $U_S$ is measured on the signal contact $O_S$, as in this example.

A coupling capacitor $C_K$ is placed between the signal contact $O_S$ and the RF port of the transceiver RF-T that prevents the test circuit and the circuits of the transceiver RF-T from influencing each other. The decoupling resistor $R_K$ reduces the load of the high frequency signal current $I_{RF}$ on the input of the window comparator COM.

Figure 2:
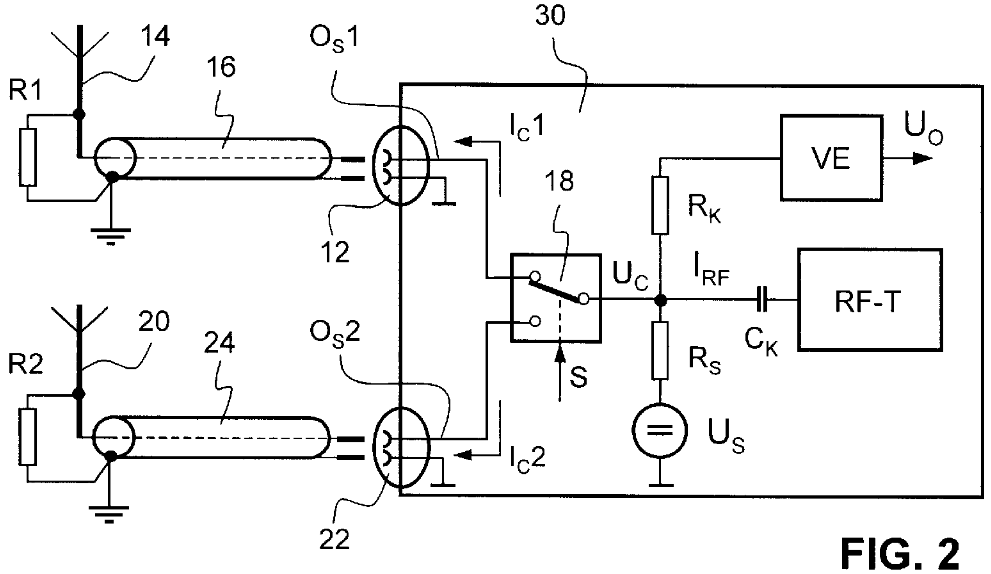
FIG. 2 A design of the circuit according to the invention with several antennas FIGS. 3*a* to 3*c* Additional designs of the circuit according to the invention with several antennas FIGS. 4 to 6 Various antenna shapes for the circuit according to the invention with rod antennas FIG. 7 A design with a spiral antenna FIG. 8 An antenna design with a vertically radiating dipole and FIG. 9 An antenna design with a sheet antenna

FIG. 2 shows a radio telephone 30 with a transceiver RF-T that is connected via an antenna selection switch 18, for example in the form of a relay, to either antenna 14 or antenna 20. In contrast to the design described above, the radio telephone 30 has an antenna connection 22 with a signal contact $O_S$2 in addition to antenna connection 12.

It is assumed that the antenna selection switch 18 is switched to the signal contact $O_S$1 of antenna connection 12. This antenna connection is then connected to the main antenna, which is located in a favorable send and receive location, and the emergency or back-up antenna is connected to antenna connection 22. Each antenna 14, 20 is connected via a separate antenna wire 16, 24 and contains a secondary path with a separate impedance, in this case resistors R1 and R2. In this design the source voltage $U_S$ is connected to the output of the antenna selection switch 18 so that the switch also switches the current paths for test currents $I_C$1 and $I_C$2 to the antennas 14, 20.

To establish a telephone connection, antenna connection 12 has priority over antenna connection 22, and the antenna selection switch 18 is usually switched to the corresponding position. During this time the test current $I_C$1 flows to antenna 14 to monitor its working, regardless of the activity of the signal current $I_{RF}$. In this design the voltage evaluator VE is a window detection circuit for DC current that constantly tests if the test voltage $U_C$ on the output of the selection switch 18 is within a specified range. If there is a short circuit or open circuit in antenna connection 12, then the test voltage will be outside of the specified range and signals that antenna 14 is definitely not ready for operation. The output signal $U_0$ of the voltage evaluator VE will then cause the unit to switch immediately to the emergency antenna, antenna 20, to restore the working of the system.

To also monitor the working of antenna 20, which is never active when antenna 14 is intact, an additional feature of the invention, a control circuit (not shown), switches the antenna selection switch 18 via the control connection S periodically from signal contact $O_S$1 to signal contact $O_S$2 for a short time when the radio telephone 30 is in stand-by mode. The signal current $I_{RF}$ does not flow during this time. However, the test current $I_C$2 does flow through the resistor R2. If the test voltage $U_C$ is outside of its specified range after switching to antenna 20 due to a malfunction on antenna connection 22, then the radio telephone 30 signals that the emergency antenna is not ready for operation acoustically or optically by showing this in its display, for example, so that it can be repaired. As the communication system will still work when there is a malfunction in the emergency antenna, telephone operations are still performed using antenna 14.

One advantage of this is that the test currents $I_C$1, $I_C$2 flow independently of the signal current $I_{RF}$ so that switching to antenna 20 is possible immediately after antenna 14 fails. Another advantage of the circuit according to FIG. 2 is that the working of the antenna selection switch 18 is constantly tested.

According to an extension of the invention, resistors R1 and R2 in the secondary paths have different resistance values depending on what type of antenna the antennas 14, 20 are. This has the advantage, that the control circuit of radio telephone 30 automatically detects the types of antennas connected to antenna connections 12 and 22 and recognizes, that each antenna is correct connected. An incorrect assigning of antennas 14, 20 to the antenna connections 12 and 22 can be corrected internally by using the antenna selection switch 18. The latter allows an antenna to be connected to either one of antenna connections 12 and 22 when mounting the antennas. To do this, the antenna selection switch 18 is advantageously designed as pulse relay or a similar device so that after the antennas 14, 20 connected are identified, a set pulse sets the antenna selection switch 18 to the position in which the preferred antenna (14), meaning the main antenna, is connected.

Furthermore, during mounting the antennas 14, 20, a test device can be connected externally to the radio telephone to test that each antenna is connected with the correct connection of the transceiver RF-T.

Even a simple display showing that the wrong type of antenna has been mounted can be implemented with this circuit.

As the transmission power for radio telephones is about four times higher that the transmission power for conventional radio telephones, the circuit can also be used to reduce inadmissibly high field strengths of the transmitter signal in the inside of the vehicle. Usually the main antenna of a radio telephone is mounted on the outside of the vehicle body at a distance to the passengers of the vehicle to keep, amongst other things, the effects of this high transmission power on the vehicle passengers low. If the secondary antenna in the inside of the vehicle receives the same power as the main antenna after the main antenna fails, then a strong transmission field can present a hazard to the health of the occupants of the vehicle. Unfavorable multiple reflections of the signal reflecting off the interior surfaces of the vehicle body can also disrupt the transmission of the transmitter signal. When such an antenna is detected, the control circuit of the transceiver RF-T, for example, will trigger the reduction of the transmission power sent to the active antenna connection. This is primarily done when, for example, the driver has forgotten to replace the removable external antenna after driving through a car wash and normal telephone operation is conducted using the emergency antenna. However, the transceiver RF-T should supply the maximum power required by the base station when an emergency call is initiated.

In this design based on the invention the voltage evaluator VE has a separate detector window for each type of antenna.

It is obvious that in practical applications the voltage evaluator VE can be placed in the digital control circuit of the radio telephone. In such a case there is an analog/digital converter on its input to convert the test voltage $U_C$ into a digital value. The windows are represented by one or more ranges of values for the digital values, and the digital value found on the converter output is tested to see if it is within this range of values. Another alternative to the voltage evaluators VE mentioned are measuring circuits to measure the amplitudes of the AC voltages as long as there is an AC current source generating the test currents $I_C$1 and $I_C$2.

Figure 3A:
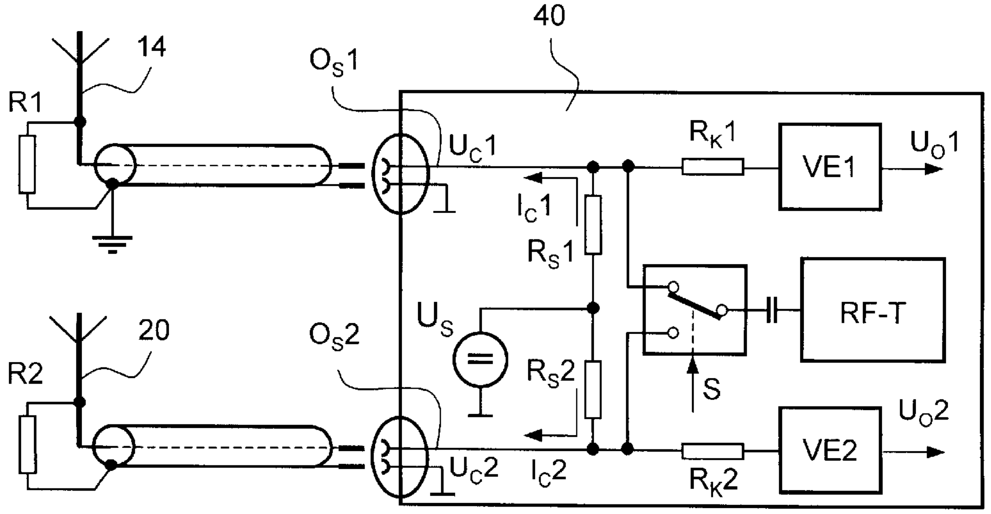
Figure 3B:
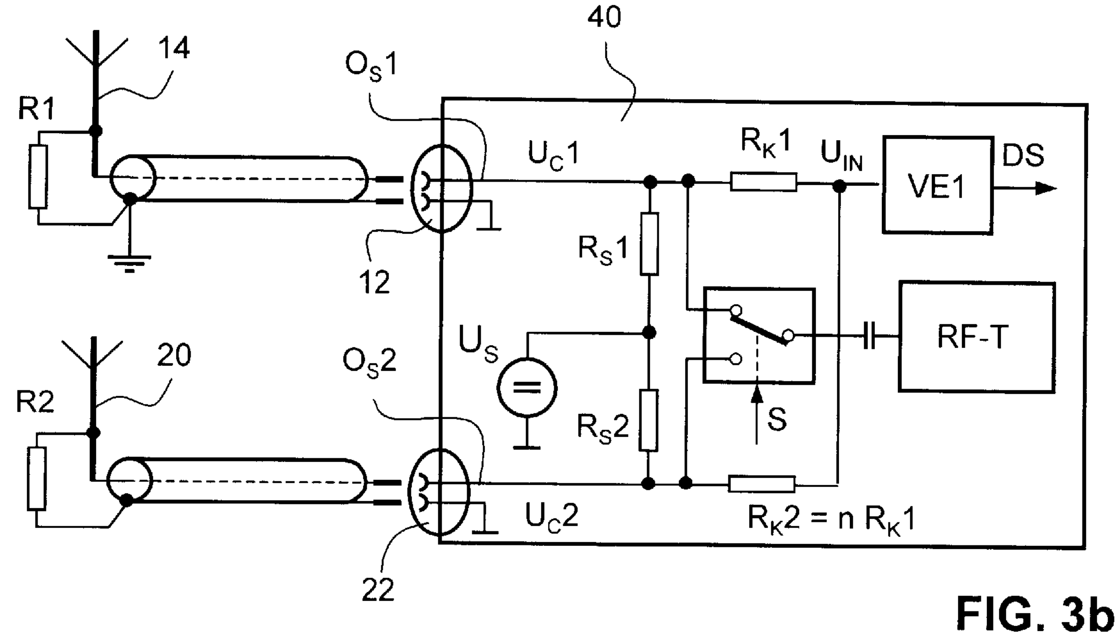
Figure 3C:
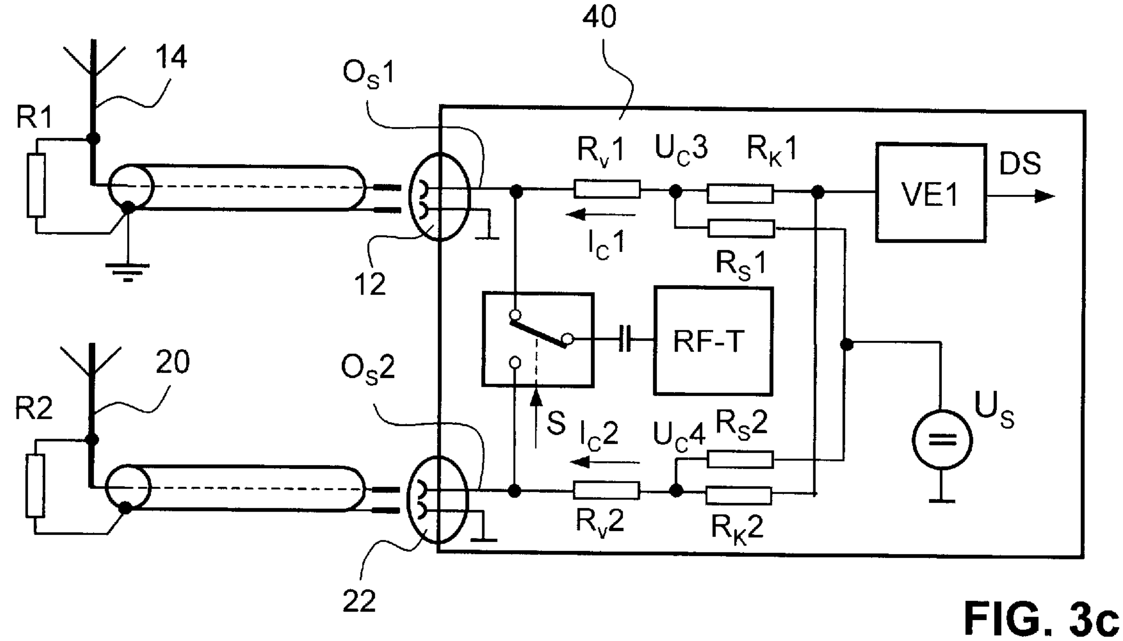

FIGS. 3*a* through 3*c* show additional designs of the invention. These designs have the advantage that the working of both antennas 14 and 20 are continuously monitored by the test currents $I_C$1 and $I_C$2 when in the send/receive mode as well as when the radio telephone 40 is in the stand-by mode. Radio telephone 40, in contrast to radio telephone 30, has separate source resistors $R_S$1 and $R_S$2 for each antenna connection 12, 23 that are connected directly to the corresponding signal contacts $O_S$1 and $O_S$2.

The design according to FIG. 3*a* also contains separate voltage evaluators VE1 and VE2 for each antenna connection 12, 22 that are connected through decoupling resistors $R_K$1 and $R_K$2 to the corresponding signal contacts $O_S$1 and $O_S$2. Depending on the corresponding test voltages $U_C$1 and $U_C$2, indication signal $U_O$1 continuously displays the working of antenna 14 and indication signal $U_O$2 continuously displays the working of antenna 20.

In contrast to this, designs based on FIG. 3*b* and FIG. 3*c* only need the voltage evaluator VE1. According to another feature of the invention, all possible combinations of working and faulty antenna connections 12 and 22 are identified by a corresponding voltage value that only arises for the specific combination. To do this, the decoupling resistors $R_K$1 and $R_K$2 combine the test voltages $U_C$1 and $U_C$2 or $U_C$3 and $U_C$4 of the two antenna connections 12 and 22, where one decoupling resistor is several times larger that the other, e.g. $R_K$2=3 $R_K$1. In addition, both decoupling resistors $R_K$1 and $R_K$2 are many times larger than the resistors R1 and R2 in the secondary paths, and the input circuit of the voltage evaluator VE1 has an electrometer input, i.e. an input with a very high input resistance $R_{IN}$>>$R_K$2. The following useful effect arises due to these two conditions:

As long as both antenna connections 12 and 22 have the same connection specifications, the resistance ratio $R_K$1:$R_K$2 does not affect the value of the input voltage $U_{IN}$ for the voltage evaluator VE1 because of the electrometer input. If both antennas 14, 20 are missing, then the input voltage $U_{IN}=U_C$. If both antennas are working and the resistors R1=$R_S$1 and R2=$R_S$2, then the input voltage $U_{IN}=0.5\ U_C$, and when both antennas contain short circuits, the input voltage $U_{IN}=0$.

However, if antenna connections 12 and 22 have different impedances connected to them, then the result is a difference $\Delta U_C$ between the test voltages $U_C$1 and $U_C$2, which then has an influence on the input voltage $U_{IN}$. The decoupling resistors $R_K$1 and $R_K$2 form a voltage divider for this difference and add the divided voltage difference $\Delta U_C$ to the smallest of the two test voltages $U_C$1 or $U_C$2. Due to the different resistivities of the two decoupling resistors $R_K$1 and $R_K$2, a different divider ratio will produce the voltage difference $\Delta U_C$ depending on which antenna connection the highest test voltage $U_C$1 or $U_C$2 can be found.

After mounting each antenna 14 and 20 can be in one of three possible connection states: "open", "ready for operation" or "short-circuited". This results in eight additional combinations in which at least one antenna is not operational in addition to the possibility that both antennas are operational. For all of these combinations the input voltage $U_{IN}$ assumes a voltage value typical for each combination that differs from the three cases stated before, depending which antenna is connected to which of the antenna connections 12, 22. This allows every fault to be associated with its corresponding antenna connection due to the typical amplitude of the voltage value.

For example, if antenna 14 is missing and antenna 20 is working, then test voltage $U_C$1=$U_S$, test voltage $U_C$2=0.5 $U_S$ and the difference $\Delta U_C=0.5\ U_S$. The difference $\Delta U_C$ is divided using the ratio N1=$R_K$2:($R_K$1+$R_K$2). Using the ratio $R_K$2=3 $R_K$1 for the decoupling resistors results in N1=3 $R_K$1:($R_K$1+3 $R_K$1), i.e., N1=3:4=0.75. The result is that the input voltage $U_{IN}=U_C$2+0.75 $\Delta U_C$ $U_{IN}=0.5\ U_S+0.5*0.75\ U_S=0.5\ U_S+0.375\ U_S=0.875\ U_S$.

However, if antenna 20 is missing and antenna 14 is working, then test voltage $U_C$1=0.5 $U_S$, test voltage $U_C$2=$U_S$ and the difference $\Delta U_C=0.5\ U_S$. The difference $\Delta U_C$ is now divided using the ratio N2=$R_K$1:($R_K$1+$R_K$2). This results in N2=$R_K$1:($R_K$1+3 $R_K$1)=1:4=0.25 and the input voltage $U_{IN}$=$U_C$2+0.25 $\Delta U_C$.

This means that the input voltage $U_{IN}=0.5\ U_S+0.125\ U_S=0.625\ U_S$ is significantly different from the input voltage in the previous combination.

However, if antenna 20 contains a short circuit and antenna 14 is working, then test voltage $U_C$1=0, test voltage $U_C$2=0.5 $U_S$ and the difference is $\Delta U_C=0.5\ U_S$. As the smallest test voltage is $U_C$1=0 and the divider ratio N2=1:4 is in effect, the result is that $U_{IN}=0.125\ U_S$.

If, however, antenna 14 contains a short circuit and antenna 20 is working, then the input voltage would be $U_{IN}=0.375\ U_S$ due to the divider ratio N2=1:4.

It is obvious from the information presented that the input voltage $U_{IN}$ assumes a typical voltage value for every possible combination of antennas where there is at least one malfunctioning antenna connection 12 or 22. This is especially advantageous when mounting antennas 14 and 20 on the radio telephone 40 because a fault can arise on both antenna connections 12, 22 in this case. The voltage evaluator VE1 in this case, being a part of the control circuit of radio telephone 40, has the task of comparing the digitized value of the input voltage $U_{IN}$ with the range of values permanently stored and to output a data signal DS that uniquely identifies the current connection state of the antenna connection 12 or 22. This signal uses the control circuit of radio telephone 40 or an analysis device connected during assembly to display errors. The current state of each connection can be conclusively determined. Even extreme error displays such as "main antenna disconnected or missing!—emergency antenna short-circuited!" can be implemented in this manner.

FIG. 3*c* also shows two additional features of the invention. The design in FIG. 3*c* is based on the design according to FIG. 3*b* and takes into account the fact that the present total of nine possible combinations of fault-free and faulty antenna connections 12, 22 can only be economically evaluated using a microcomputer that is connected to an analog/digital converter. A disadvantage of this is that many analog/digital converters for microcomputers only work properly when the input voltage $U_{IN}$ is above a minimum value due to the asymmetric voltage supplies of microcomputers. To eliminate this disadvantage simply according to another feature of the invention, resistors $R_V$1 and $R_V$2 are connected in series to the source resistors $R_S$1 and $R_S$2, respectively, and the decoupling resistors $R_K$1 and $R_K$2 are connected to the connection points of the series resistors. In this manner the test voltages $U_C$3 and $U_C$4 have a minimum voltage value that arises from the test current $I_C$1 and $I_C$2 passing through series resistors $R_V$1 and $R_V$2, respectively, even when there is a short circuit in the antenna connection 12 or 22, so that the analog/digital converter of the voltage evaluator VE1 works properly.

According to another feature of the invention, these series resistors $R_V$1 and $R_V$2 are also used to identify the case in which the two antennas 14, 20 are connected incorrectly and have been swapped in addition to the nine possible combinations of antenna states already mentioned. This is accomplished due to the fact that, on the one hand, antennas 14 and 20 have different resistors $R_1$, $R_2$ in the secondary paths according to the type of antenna, and on the other hand, the values for the series resistors $R_V1$ and $R_V2$ are selected so that for both antenna connections 12, 22 the sum of the resistance value of resistor R1 or R2 in the secondary path and its corresponding series resistor $R_V1$ or $R_V2$ are the same, meaning $R1+R_V1=R2+R_V2$. This has the advantage that the typical voltage values stated for the input voltage $U_{IN}$ on an intact antenna can only arise when the antennas 14, 20 have not been swapped on the antenna connections 12, 22. The following resistance ratios have been found to be favorable: $R_S1=R_S2$; $R_S1=R_S1+R_V1$ and $R_S2=R2+R_V2$, where $R1=0.5\ R_S1$ and $R_V1=0.5\ R_S1$ in one secondary branch and $R2=0.75\ R_S1$ and $R_V2=0.25\ R_S1$ in the other secondary branch are advantageous values. It is obvious that when both antennas 14, 20 are correctly connected the test voltage values are $U_C3=U_C4=0.5\ U_S$ while the test voltage values respond according to the ratio of the sums $(R2+R_V1):(R1+R_V2)=(0.75+0.5):(0.5+0.25)=1.25:0.75=5:3$ when the antennas 14, 20 have been swapped.

Another advantage of the solution according to the invention is that the resistance values selected for source resistors $R_S1$ and $R_S2$ as well as for resistors R1 and R2 in the secondary paths can be so high that the test currents $I_C1$ and $I_C2$ place an insignificant load on the operating current supply of the radio telephone 10, 30 or 40. In practical applications, for example, the resistance values of the source resistors $R_S$, $R_S1$ and $R_S2$ and of resistors R1 and R2 are about 10 kΩ and the test currents $I_C1$ and $I_C2$ are under 1 mA. In addition the values for the coupling resistors $R_K$, $R_K1$ and $R_K2$, source resistors $R_S$, $R_S1$ and $R_S2$ and resistors R1 and R2 are calculated so that the influence of the entire detection circuit on the RF circuit of the radio telephone 10, 30 or 40 is minimal. Another advantage of the invention is that it indicates when the wrong type of antenna was connected to antenna connections 12, 22 during the assembly of the vehicle. An example of this is when a radio antenna that does not have a secondary path was connected.

Figure 4:
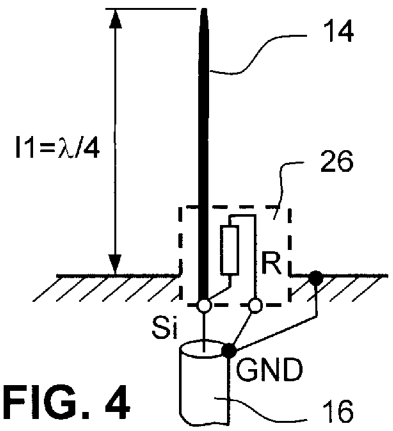
Figure 5:
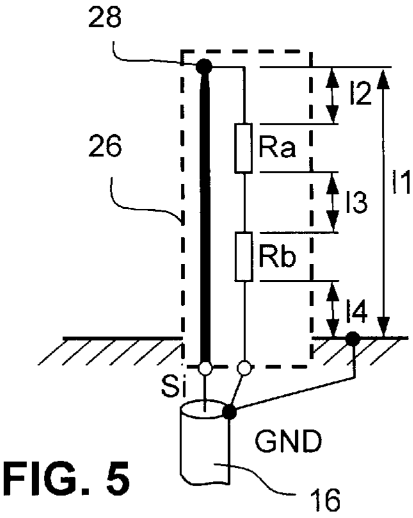
Figure 6:
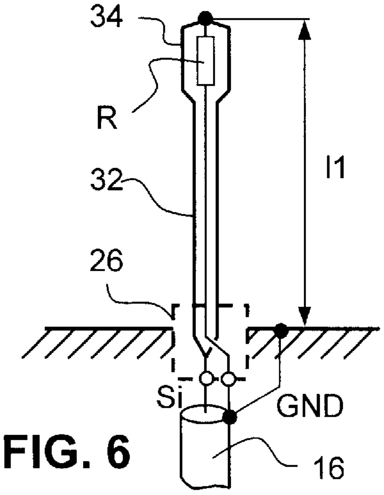

FIGS. 4 through 8 show different types of antennas for the circuit according to the invention. The antennas in FIGS. 4 through 6 are λ/4 vertical radiators with a rod length I1=λ/4. The term λ signifies the transmission wavelength.

FIG. 4 shows an especially economical design for an antenna with a resistor R placed directly between the RF connection Si and the ground connection GND. Box 26 represents a non-conductive shell for the area near the base of the rod that mechanically connects resistor R to the pole radiator. In this manner removing the antenna 14 or breaking off the antenna 14 at the breaking point designed into the area near the base support will also open-circuit the secondary path containing resistor R, resulting in the desired detection by the circuit in the radio telephone 10, 30 or 40.

While the antenna according to the design in FIG. 4 requires a constructive step that ensures that the antenna will break off at the base of the rod, the antenna according to FIG. 5 can break at any location. To accomplish this an impedance with distributed components is placed between a connection point at the top of antenna 28 and the ground connection GND. In the case presented there is a set of at least two single resistors Ra and Rb connected in series. This design allows a secondary path with discrete ohmic resistors to be added to the outside of the body of the antenna. To suppress the RF activity in the feed cables to the distributed single resistors Ra and Rb from acting like an antenna, their feed cable lengths I2 through I4 can be selected so that each length is shorter than λ/10. In accordance with the desired radiation characteristics of the antenna, it can also be advantageous to design the feed cable length I2 to be especially short and to distribute the remaining length: $I_R$=I1−I2−(length of the individual resistors Ra+Rb) amongst the feed cable lengths I3 and I4. In this antenna design the non-conductive shell encloses the entire radiating rod, the single resistors Ra+Rb and their feed cables.

FIG. 6 shows a pole radiator 32 that is designed as a hollow body. It has a head 34 with a larger diameter at the top end. The secondary path with a resistor R is placed inside the hollow body 32. The location of the resistor R in the head 34 also guarantees the working of the circuit in this design when the pole radiator 32 breaks off at any location. Due to the placement of the secondary path in the interior, no influence on the radiation characteristics of the antenna is to be expected. Only the length I1 of the pole radiator 32 must be shortened slightly as a result of the larger capacitance of the head 34 with respect to ground.

Figure 7:
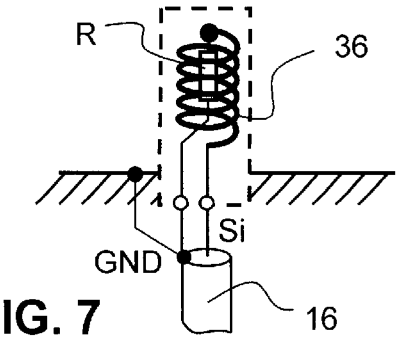

For the antenna according to FIG. 7 the secondary path with the resistor R also passes through the inside of the radiator 36. However, a single-sided (for the RF circuit) open conductive coil is used as the radiator 36 whose length is significantly less than that of a pole radiator.

Figure 8:
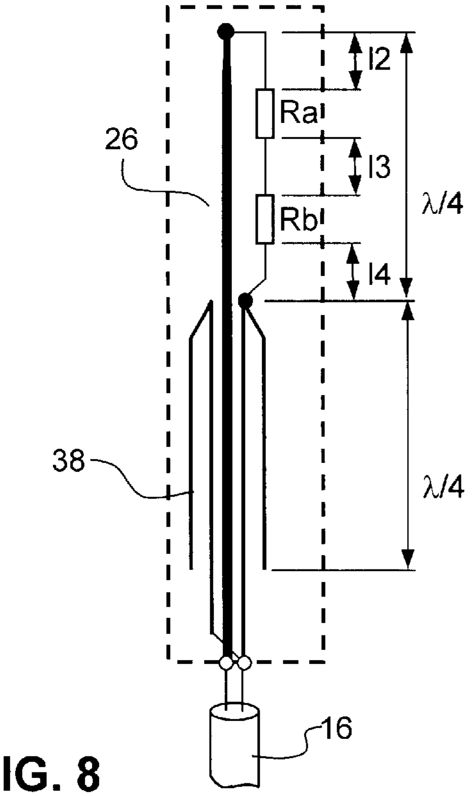

Based on FIG. 8 it is shown that the principle of the invention can also be applied to λ/2 dipole antennas that are open at the ends. The design presented shows a λ/2 vertical radiator in the form of an axially supplied dipole. The layout of the secondary path corresponds to that of the design according to FIG. 5. In addition, the secondary path can also be designed in accordance with FIGS. 4 and 6 for λ/2 dipole antennas.

Figure 9:
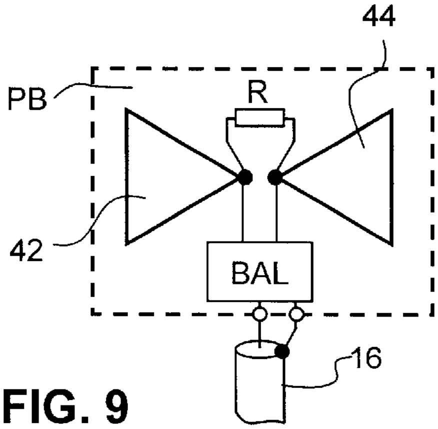

FIG. 9 shows the design of a flat plane antenna that can be installed on the inside of the vehicle as an emergency antenna, for example. Dipole surfaces 42 and 44 are placed on a circuit board PB together with the resistor R and a balancer BAL. The balancer BAL has electrical connections between the inputs and outputs, for example a bypass conductor, and is therefore advantageously included in the constant monitoring of the working of the antenna.

What is claimed is:

1. A circuit for testing the working of at least one antenna for a radio telephone having a control circuit, said circuit comprising:

- a test current that is sent in an RF path via an antenna to the antenna by a voltage source independent of an RF signal current flowing on said RF path via said antenna wire, and
- a measuring device, connected between said antenna wire and a common return, to monitor the continuity of the test current,
- wherein each antenna has a radiator with one end that open rises up into the space,
- wherein a secondary path parallel to the RF path containing an impedance is connected to each radiator and to the common return to return separate test currents,
- wherein the monitoring of the test current is performed by a voltage evaluator, and
- wherein there are resistors connected in series in the secondary path with feed cables whose lengths are shorter than one-tenth of the transmission wavelength so that the feed cables do not significantly affect the high-frequency characteristics of the radiator.

2. A circuit for testing the working of at least one antenna for a radio telephone having a control circuit, said circuit comprising:

- a test current that is sent in an RF path via an antenna to the antenna by a voltage source independent of an RF signal current flowing on said RF path via said antenna wire, and a measuring device, connected between said antenna wire and a common return, to monitor the continuity of the test current;

wherein each antenna has a radiator with one end that open rises up into the space, wherein a secondary path parallel to the RF path containing an impedance is connected to each radiator and to the common return to return separate test currents, wherein the monitoring of the test current is performed by a voltage evaluator, and wherein the secondary path with the impedance is located in the interior of the body of the antenna.

3. A circuit for testing the working of at least one antenna for a radio telephone having a control circuit, said circuit comprising:

a test current that is sent in an RF path via an antenna to the antenna by a voltage source independent of an RF signal current flowing on said RF path via said antenna wire, and a measuring device, connected between said antenna wire and a common return, to monitor the continuity of the test current, wherein each antenna has a radiator with one end that open rises up into the space, wherein a secondary path parallel to the RF path containing an impedance is connected to each radiator and to the common return to return separate test currents, wherein the monitoring of the test current is performed by a voltage evaluator, and wherein the test current is either a DC current or an AC current with a wavelength that is many times longer than the transmission wavelength of the signal current.

4. A circuit for testing the working of at least one antenna for a radio telephone having a control circuit, said circuit comprising:

a test current that is sent in an RF path via an antenna to the antenna by a voltage source independent of an RF signal current flowing on said RF path via said antenna wire, and a measuring device, connected between said antenna wire and a common return, to monitor the continuity of the test current, wherein each antenna has a radiator with one end that open rises up into the space, wherein a secondary path parallel to the RF path containing an impedance is connected to each radiator and to the common return to return separate test currents, wherein the monitoring of the test current is performed by a voltage evaluator, and wherein by several antenna connections, which are each connectable to the antenna wire, for antennas are alternately connected to a transceiver by an antenna selection switch and contain secondary paths with separate test currents flowing through them.

5. A circuit according to claim 4, wherein during stand-by mode of the radio telephone, a control circuit periodically switches an antenna selection switch from a primary antenna to a secondary antenna for a short time via a control input to test the working of the secondary antenna.

6. A circuit according to claim 4, wherein there is a separate voltage evaluator present for the test voltage of each antenna connection.

7. A circuit according to claim 4, wherein decoupling resistors $R_K1$ and $R_K2$ combine the test voltages of the antenna connections so that a voltage evaluator analyzes the combined input voltage from both antenna connections, and in that one decoupling resistor is larger than the other to allow the voltage evaluator to unambiguously associate a fault with the corresponding antenna connection.

8. A circuit according to claim 7, wherein the voltage evaluator detects a number of different typical input voltages corresponding to the number of possible combinations of faults on the antenna connections by comparison with stored ranges of values and outputs these as a data signal, and wherein a control circuit generates and outputs correspondingly detailed error messages for the data signal output.

9. A circuit according to claim 4, wherein the secondary paths have resistors with different resistance values depending on the type of the antenna so that the control circuit of the radio telephone can differentiate between the antennas connected to a plurality of antenna connections, which are each connectable to the antenna wire, according to their type and automatically detect which antenna is connected to which antenna connection using the corresponding voltage evaluator.

10. A circuit according to claim 9, wherein after detecting which antenna is connected to which antenna connection, the control circuit, switches an antenna selection switch to that position in which the antenna connection of the transceiver is connected internally to a preferred antenna.

11. A circuit according to claim 9, wherein after detecting which antenna is connected to which antenna connection, the control circuit generates an error message for a display and/or correspondingly configures the input/output data for the antenna connections.

12. A circuit according to claim 9, wherein values for series resistors are selected so that for both antenna connections the sum of the values of the corresponding resistor in the secondary path and the resistor connected in series to it are the same in order to unambiguously identify the case in which the antennas are connected incorrectly and are swapped.

13. A circuit according to claim 4, wherein each secondary path contains at least one ohmic resistor and a voltage evaluator on the antenna connection compares the value of the test voltage induced by the test current to a reference value to test the working of the corresponding antenna.

14. A circuit according to claim 13, wherein during stand-by mode of the radio telephone, a control circuit periodically switches the antenna selection switch from a primary antenna to a secondary antenna for a short time via a control input to test the working of the secondary antenna.

15. A circuit according to claim 13, wherein there is a separate voltage evaluator present for the test voltage of each antenna connection.

16. A circuit according to claim 13, wherein the secondary paths have resistors with different resistance values depending on the type of the antenna so that the control circuit of the radio telephone can differentiate between the antennas connected to the antenna connections according to their type and automatically detect which antenna is connected to which antenna connection using the corresponding voltage evaluator.

17. A circuit according to claim 16, wherein after detecting which antenna is connected to which antenna connection, the control circuit, switches the antenna selection switch to that position in which the antenna connection of the transceiver is connected internally to a preferred antenna.

18. A circuit according to claim 16, wherein after detecting which antenna is connected to which antenna connection, the control circuit generates an error message for a display and/or correspondingly configures the input/output data for the antenna connections.

19. A circuit according to claim 16, wherein the values for the series resistors are selected so that for both antenna connections the sum of the values of the corresponding resistor in the secondary path and the resistor connected in series to it are the same in order to unambiguously identify the case in which the antennas are connected incorrectly and are swapped.

20. A circuit according to claim 13, wherein decoupling resistors $R_K$1 and $R_K$2 combine the test voltages of the antenna connections so that a voltage evaluator analyzes the combined input voltage from both antenna connections, and wherein one decoupling resistor is larger than the other to allow the voltage evaluator to unambiguously associate a fault with the corresponding antenna connection.

21. A circuit according to claim 20, wherein the voltage evaluator detects a number of different typical input voltages corresponding to the number of possible combinations of faults on the antenna connections by comparison with stored ranges of values and outputs these as a data signal, and wherein a control circuit generates and outputs correspondingly detailed error messages for the data signal output.

22. A circuit according to claim 20, wherein resistors $R_V$1 and $R_V$2 are placed in series with the source resistors $R_S$1 and $R_S$2, respectively, and wherein the voltage evaluator is connected to the connection points of that series circuit via decoupling resistors $R_K$1 and $R_K$2.

23. A circuit according to claim 22, wherein the values for the series resistors are selected so that for both antenna connections the sum of the values of the corresponding resistor in the secondary path and the resistor connected in series to it are the same in order to unambiguously identify the case in which the antennas are connected incorrectly and are swapped.

24. A circuit for testing the working of at least one antenna for a radio telephone having a control circuit, said circuit comprising:

a test current that is sent in an RF path via an antenna to the antenna by a voltage source independent of an RF signal current flowing on said RF path via said antenna wire, and a measuring device, connected between said antenna wire and a common return, to monitor the continuity of the test current, wherein each antenna has a radiator with one end that open rises up into the space, wherein a secondary path parallel to the RF path containing an impedance is connected to each radiator and to the common return to return separate test currents, wherein the monitoring of the test current is performed by a voltage evaluator, and wherein each secondary path contains at least one ohmic resistor and a voltage evaluator, on an antenna connection, which is connectable to the antenna wire, that compares the value of the test voltage induced by the test current to a reference value to test the working of the corresponding antenna.

25. A circuit according to claim 24, wherein during stand-by mode of the radio telephone, a control circuit periodically switches the antenna selection switch from a primary antenna to a secondary antenna for a short time via a control input to test the working of the secondary antenna.

26. A circuit according to claim 24, wherein there is a separate voltage evaluator present for the test voltage of each antenna connection.

27. A circuit according to claim 24, wherein the secondary paths have resistors with different resistance values depending on the type of the antenna so that the control circuit of the radio telephone can differentiate between the antennas connected to the antenna connections according to their type and automatically detect which antenna is connected to which antenna connection using the corresponding voltage evaluator.

28. A circuit according to claim 27, wherein after detecting which antenna is connected to which antenna connection, the control circuit, switches the antenna selection switch to that position in which the antenna connection of the transceiver is connected internally to a preferred antenna.

29. A circuit according to claim 27, wherein after detecting which antenna is connected to which antenna connection, the control circuit generates an error message for a display and/or correspondingly configures the input/output data for the antenna connections.

30. A circuit according to claim 27, wherein the values for the series resistors are selected so that for both antenna connections the sum of the values of the corresponding resistor in the secondary path and the resistor connected in series to it are the same in order to unambiguously identify the case in which the antennas are connected incorrectly and are swapped.

31. A circuit according to claim 24, wherein decoupling resistors $R_K$1 and $R_K$2 combine the test voltages of the antenna connections so that a voltage evaluator analyzes the combined input voltage from both antenna connections, and wherein one decoupling resistor is larger than the other to allow the voltage evaluator to unambiguously associate a fault with the corresponding antenna connection.

32. A circuit according to claim 31, wherein the voltage evaluator detects a number of different typical input voltages corresponding to the number of possible combinations of faults on the antenna connections by comparison with stored ranges of values and outputs these as a data signal, and wherein a control circuit generates and outputs correspondingly detailed error messages for the data signal output.

33. A circuit according to claim 31, wherein resistors $R_V$1 and $R_V$2 are placed in series with the source resistors $R_S$1 and $R_S$2, respectively, and wherein the voltage evaluator is connected to the connection points of that series circuit via decoupling resistors $R_K$1 and $R_K$2.

34. A circuit according to claim 33, wherein the values for the series resistors are selected so that for both antenna connections the sum of the values of the corresponding resistor in the secondary path and the resistor connected in series to it are the same in order to unambiguously identify the case in which the antennas are connected incorrectly and are swapped.

35. A circuit for testing the working of at least one antenna for a radio telephone having a control circuit, said circuit comprising:

a test current that is sent in an RF path via an antenna to the antenna by a voltage source independent of an RF signal current flowing on said RF path via said antenna wire, and a measuring device, connected between said antenna wire and a common return, to monitor the continuity of the test current, wherein each antenna has a radiator with one end that open rises up into the space, wherein a secondary path parallel to the RF path containing an impedance is connected to each radiator and to the common return to return separate test currents, wherein the monitoring of the test current is performed by a voltage evaluator, wherein resistors $R_V1$ and $R_V2$ are placed in series with source resistors $R_S1$ and $R_S2$, respectively, and wherein the voltage evaluator is connected to connection points of that series circuit via decoupling resistors $R_K1$ and $R_K2$.

36. A circuit according to claim 35, wherein the values for the series resistors are selected so that for both antenna connections the sum of the values of the corresponding resistor in the secondary path and the resistor connected in series to it are the same in order to unambiguously identify the case in which the antennas are connected incorrectly and are swapped.

37. A test circuit for testing the working of an antenna of a radio telephone, antenna having a radiator with one end that open rises upon into space, said test circuit comprising:

a secondary path associated with said antenna that is connected in parallel with a RF path of said antenna, a voltage source which feeds a separate test current independently from an RF signal currently flowing on said RF path via an antenna wire which is connected to said antenna, wherein said secondary path comprises:

an impedance inseparably connected with said radiator of said antenna and a common return to return said test current, said impedance being connected in a manner so that removal or breaking off of said radiator will cause said secondary path with said impedance to be disconnected, and a voltage evaluator connected between the antenna wire and the common return to monitor the continuity of said test current.

38. A test circuit according to claim 37, wherein said impedance in said secondary path is connected to said radiator via a connection wire, the length of which is shorter than one-tenth of the transmission wavelength.

39. The test circuit according to claim 37, wherein said impedance in said secondary path is many times higher than a radiation resistance of the antenna.

* * * * *